(12) United States Patent
Kim

(10) Patent No.: US 6,376,310 B1
(45) Date of Patent: Apr. 23, 2002

(54) FABRICATION METHOD OF NONVOLATILE MEMORY DEVICE

(75) Inventor: Yong Hee Kim, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 09/722,659

(22) Filed: Nov. 28, 2000

(30) Foreign Application Priority Data

Jul. 19, 2000 (KR) .............................. 00-41386

(51) Int. Cl.$^7$ ............................................ H01L 21/336
(52) U.S. Cl. ...................................... 438/263; 365/185
(58) Field of Search ................................ 438/263, 697, 438/700; 365/185; 257/623, 208, 314, 401, 316, 319, 321

(56) References Cited

U.S. PATENT DOCUMENTS 5,792,696 A    8/1998   Kim et al.
6,057,574 A  * 5/2000   Hisamune .................. 257/315
6,121,670 A  * 9/2000   Hisamune .................. 257/623

* cited by examiner

*Primary Examiner*—David Nelms
*Assistant Examiner*—David Vu

(57) ABSTRACT

The method of fabricating a nonvolatile memory device having improved reliability and characteristics includes the step of forming a second conductivity type transistor in a peri (peripheral) region of a first conductivity type semiconductor substrate. Then a first insulation film is formed on the peri region. Afterwards the method includes the steps of forming a plurality of separated first floating gates on a cell region of the substrate with a gate insulation film therebetween, forming a second insulation film having contact holes over the substrate so as to expose a portion of each first floating gates, forming a second floating gate in each contact hole and on the second insulation film, stacking a control gate and a cap insulation film in sequence on the second floating gate with a third insulation film therebetween, forming a fourth insulation film sidewall on each side of the control gate and the cap insulation film, forming a tunneling insulation film on an exposed portion of the second floating gate, and forming an erase gate on the tunneling insulation film between two adjacent control gates.

18 Claims, 8 Drawing Sheets

FABRICATION METHOD OF NONVOLATILE MEMORY DEVICE

BACKGROUND OF THE INVENTION

1. Field of the Invention

The present invention relates to a fabrication method of a nonvolatile memory device, more particularly, to a fabrication method for improving characteristics and reliability of the nonvolatile memory device.

2. Discussion of the Related Arts

Generally, an effective cell size of a memory cell relating to an integrity of a nonvolatile memory device such as flash EEPROM (Electrically Erasable Programmable Read Only Memory), EEPROM, etc. is determined by two factors.

One of the two factors is a size of a unit cell, and the other is a structure of a cell array. With respect to the memory cell, the minimum cell structure is a simple stacked gate structure.

As the application of a nonvolatile memory has been extended, research and development of the nonvolatile memory such as a flash EEPROM and a flash memory card has been getting more and more attention.

When the nonvolatile semiconductor memory devices such as flash EEPROM, EEPROM, etc., are used as a mass storage media, the most serious problem is the high cost per bit.

Furthermore, for the chip to be used for portable products, low power consumption is required. In order to lower the cost per bit, lots of research in multi bit cells have been conducted.

The integrity of a conventional nonvolatile memory has a one-to-one corresponding relationship to a number of memory cells. On the other hand, a multi bit cell can enhance, remarkably, the integrity of data storage in an identical chip area by storing data of more than one bit per cell instead of reducing the size of the memory cell.

To implement the above-mentioned multi bit cell, each memory cell should be programmed so as to have more than three threshold voltage levels.

For example, in order to store data of two bits per cell, each cell must be programmed so as to have a threshold voltage of four levels ($2^2$=4). The four levels of the threshold voltage correspond to logical states 00,01,10,11, respectively.

The most serious problem in the multi level program is that each threshold voltage level has a statistical deviation of about 0.5V from a nominal value.

Accordingly, when the threshold voltage level is precisely adjusted and therefore the deviation in threshold voltage is decreased, the threshold voltage can be programmed with more levels and the number of bits per cell can be increased. In general, in order to reduce deviation in the threshold voltage level, a programming technique which repeatedly performs a programming operation and a verifying operation is used, In order to program a nonvolatile memory cell to be at a desired threshold voltage level, a series of voltage pulses is applied to the cell.

In order to verify whether or not the threshold voltage of the cell reaches a desired voltage level, a read operation is performed at a time between two adjacent pulses of the voltage pulses. When the result of the verifying operation indicates that the memory cell has reached the desired threshold voltage level, the programming operation is completed, According to the above-mentioned technique in which the read and verifying operations are repeatedly performed, it is not easy to reduce the error deviation of the threshold voltage caused by a finite pulse width of the program voltage.

Since an algorithm in which the programming and verifying operations are repeatedly performed is implemented in a circuit, the area for a peripheral circuit is enlarged and the program time for the above-mentioned method becomes long.

FIG. 1A is a cross sectional view showing a structure of a general simple stacked nonvolatile memory device. FIG. 1B is a schematic symbol of a general nonvolatile memory cell.

As shown in FIG. 1A, a floating gate 3 is formed on a p type semiconductor substrate 1 with a tunneling oxide film 2 between the floating gate and the semiconductor substrate. A control gate 5 is formed on the floating gate 3. A dielectric film 4 is formed between the control gate 5 and the floating gate 3.

A n type source region 6a and a n type drain region 6b are formed in a surface of a p type semiconductor substrate 1, and are located at both sides of the floating gate 3. The simple stacked gate nonvolatile memory device having the aforementioned structure has disadvantages as follows: its effective cell size and a coupling constant of the control gate 5 are small, and the coupling constant is reduced as the effective cell size of the nonvolatile memory cell is decreased.

Accordingly, in order to prevent the coupling constant value from being reduced, the dielectric film 4 between the floating gate 3 and the control gate 5 is made of an Oxide Nitride Oxide (ONO) film, but a fabrication process of the ONO film is complicated and requires a high temperature annealing process. As shown in FIG. 1B, each nonvolatile memory cell comprises a floating gate 3, as depicted in FIG. 1A, the control gate 5 for controlling an amount of charges to be supplied to the floating gate 3 for programming, and a field effective transistor for reading (or verifying) the amount of the charges supplied to the floating gate 3.

The field effect transistor comprises a floating gate 3, a source 6a, a drain 6b, and a channel region 7 between the drain 6b and the source 6a.

A programming operation of the nonvolatile memory cell having the aforementioned structure is performed by the current flowing between the drain 6b and the source 6a when the control gate 5 and the drain 6b are supplied with voltages high enough to cause programming.

The current is compared with a reference current. When the current is equal to or less than the reference current, a programming completion signal is generated.

A conventional fabrication method of a nonvolatile memory device will be described with reference to FIG. 2A to FIG. 2K.

FIG. 2A to FIG. 2K are cross sectional views showing the processes of a fabrication method of a nonvolatile memory device.

As shown in FIG. 2A, an oxide film for separating elements (not shown) is formed on a surface of a p type semiconductor substrate 11 on which a cell region and a peri (or peripheral) region are defined. A cell gate insulation film 12 is formed on an active region of the semiconductor substrate 11.

In this case, the cell gate insulation film 12 is formed on the entire surface of the semiconductor substrate 11 of the cell region and the peri region.

A first polysilicon layer 13 for floating gate is formed on the cell gate insulation film 12. The first polysilicon layer 13 is selectively removed by a photolithography technique and etching process so that a plurality of first floating gates 13a are formed.

As shown in FIG. 25, a first insulation film 14 is formed on the entire surface of the semiconductor substrate 11 including the first floating gate 13a and then is selectively removed by a photolithography technique and an etching process so that a plurality of contact holes are formed. Each of the plurality of contact holes is in one to one correspondence with one of the plurality of first floating gates 13a, and a first portion of each surface of the floating gates 13a is exposed through the corresponding contact hole.

Thereafter, a second polysilicon layer 15 is formed on the semiconductor substrate 11 and at the same time fills the plurality of contact holes.

On the other hand, the first insulation film 14 formed on the peri region of the semiconductor substrate 11 is removed when the contact holes are formed.

As shown in FIG. 2C, a second insulation film 16 for controlling an amount of charges of the floating gate is made of an ONO (Oxide Nitride Oxide) film or CVD insulation film on the second polysilicon layer 15.

As shown in FIG. 2D, a third polysilicon layer 17 for forming a control gate is formed on the second insulation film 16. A cap insulation film is formed on the third polysilicon layer 17 and thereafter selectively removed by a photolithography technique and an etching process so that a plurality of the cap insulation films 18 are formed on the third insulation film 17. Each of the plurality of cap insulation films 18 correspond to only one of the plurality of contact holes.

As shown in FIG. 2E, a first photoresist 19 is deposited on the semiconductor substrate 11 Including the cap insulation film 18 and then is patterned by exposure and development process.

Using the patterned first photoresist 19 and the cap insulation film 18 as a mask, the third polysilicon layer 17 is selectively removed so that a plurality of control gates 17a are formed.

As shown in FIG. 2F, the first photoresist 19 is completely removed. Thereafter, by using the cap insulation film 18 as a mask and performing a blank etch process, the second insulation film 16 and the second polysilicon layer 15 are selectively removed. As a result, a plurality of second floating gates 15a are formed.

In this case, a portion of each of the control gates 17a which is not overlapped with the cap insulation film 18 is selectively removed by the blank etch process and at the same time the second insulation film 16 and the second polysilicon layer 15 which are formed below the control gates 17a are also selectively removed. As a result, the second insulation film 16 has the same width as the control gate 17a and the second floating gate 15 has the same width as the original control gates 17a depicted in FIG. 2E.

In this case, the control gate 17a and the second insulation film 16 which are formed on the peri region of the semiconductor substrate 11 are completely removed from the peri region, but the second polysilicon layer 15 formed on the peri region remains on the peri region.

Thereafter, a third insulation film 20 is formed on the entire surface of the semiconductor substrate 1 1 including the cap insulation film 18.

As shown in FIG. 2G, a second photoresist 21 is formed on the third insulation film 20 and thereafter is patterned by an exposure and etching process to remain only in the cell region.

Using the patterned second photoresist 21 as a mask, the second polysilicon layer 15, the first polysilicon layer 13 and the cell gate insulation film 12 that have been formed in the peri region are removed.

On the other hand, when the second polysilicon layer 15, the first polysilicon layer 13 and the cell gate insulation film 12 are removed from the peri region, the first polysilicon layer 13 and the second polysilicon layer 15 may remain on the sides of the first insulation film 14 as sidewalls. Therefore, an over-etch process is performed in this case.

As shown in FIG. 2H, by using the second photoresist 21 as a mask, channel ions 22 are implanted in the peri region of the semiconductor substrate 11.

As shown in FIG. 2I, the second photoresist 21 is removed. Thereafter, a third photoresist 23 is formed on the semiconductor substrate 11 and then patterned by an exposure and development process to remain only on the peri region of the semiconductor substrate 11.

An etch back process is performed on the entire surface by using the patterned third photoresist 23 as a mask. As the result, a third insulation film sidewall 20a is formed on each side of the cap insulation films 18 and the control gates 17a.

As shown in FIG. 2J, the third photoresist 23 is removed. Thereafter, by performing an oxidation process on the semiconductor substrate 11, a tunneling insulation film 24 and a peri gate insulation film 25 are formed on the exposed surface of the second floating gate 15a and on the peri region of the semiconductor substrate 11, respectively.

As shown in FIG. 2K, a third polysilicon layer for forming an erasure gate is formed on the semiconductor substrate 11 and then selectively removed by a photolithography and etch process. Therefrom, erasure gates 26a on the cell region and a gate electrode 26b on the peri region are simultaneously formed. The processes for forming a source/drain impurity region and wiring are not illustrated in the drawings.

The above-mentioned conventional fabrication method of the nonvolatile memory device has problems as follows:

First, in order to improve reliability and characteristics of the cell, the gate insulation film is as thin as possible. However, since the semiconductor substrate of the peri region may be damaged when the over etch process is performed to remove the first and second polysilicon layers for floating gate material remaining on the peri region, a thick gate insulation film must be formed for preventing the semiconductor substrate from being damaged.

Second, since the gate insulation film on the peri region and the tunneling insulation film on the cell region are simultaneously formed and therefrom the gate insulation film in the peri region is also changed as the characteristics and thickness of the tunneling insulation film is adjusted to improve characteristics of the cell, the characteristics of the peri elements are not guaranteed.

Third, when the erase gate and the gate electrode are simultaneously formed, it results in a step difference between the peri region and the cell region. Therefore, it is difficult to form a pattern of desired size because a focus difference in a photolithography technique is caused by the step difference.

SUMMARY OF THE INVENTION

The present invention is directed to solve the problems of the conventional fabrication method of a nonvolatile memory device described as above.

One object of the present invention is to provide a fabrication method of nonvolatile memory device separately adjusting a thickness of a gate insulation film so as to guarantee reliability and characteristics of the memory cell.

Another object of the present invention is to provide a fabrication method of nonvolatile memory device adjusting a thickness and characteristics of tunneling insulation film in a cell region as well as guaranteeing characteristics of peri elements by forming a tunneling insulation film and a peri gate insulation film by an independent process, respectively.

A further object of the present invention is to provide a fabrication method of nonvolatile memory device improving a process margin of a photolithography technique in a wiring process by forming independently peri gate electrodes and erase gates and then reducing a step difference between the cell region and the peri region as well as improving a focus margin of a photolithography technique.

To achieve these and other advantages and in accordance with the purpose of the present invention, as embodied and broadly described, the fabrication method of nonvolatile memory device according to the present invention comprises the steps of: forming a second conductivity type transistor in a peri region of a first conductivity type semiconductor substrate on which a cell region and said peri region are defined; forming a first insulation film in said peri region of the semiconductor substrate; forming a plurality of first floating gates separated by a predetermined interval on said cell region of said semiconductor substrate with a gate insulation film between the cell region and each of the plurality of first floating gates; forming a second insulation film on the entire surface of said semiconductor substrate so as to have a plurality of contact holes in one to one correspondence to each of said plurality of first floating gates and to expose a portion of surface of the corresponding one of said plurality of first floating gates; forming a plurality of second floating gates, each of the second floating gates formed in one of said plurality of contact holes and on said second insulation film in proximity to the corresponding contact hole; stacking a control gate and a cap insulation film in sequence on a first portion of each surface of said plurality of second floating gates with a third insulation film between the control gate and the portion of the corresponding second floating gate; forming a fourth insulation film sidewall in each side of said plurality of cap insulation films and said plurality of control gates; forming a tunneling gate on an exposed portion of each surface of said plurality of second floating gates; and forming an erase gate on each surface of said plurality of tunneling insulation films and on each region between two adjacent control gates so as to overlap with a first portion of the upper surface of the two adjacent control gates.

Additional features and advantages of the present invention will be set forth in the description that follows, and in part will be apparent from the description, or may be learned by practice of the invention. The objects and other advantages of the invention will be realized and attained by the structure particularly pointed out in the written description and claims hereof as well as the accompanying drawings.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

FIG. 3A to FIG. 3I illustrates cross sectional views for the fabrication process of nonvolatile memory device in accordance with the present invention.

Figure 1A:
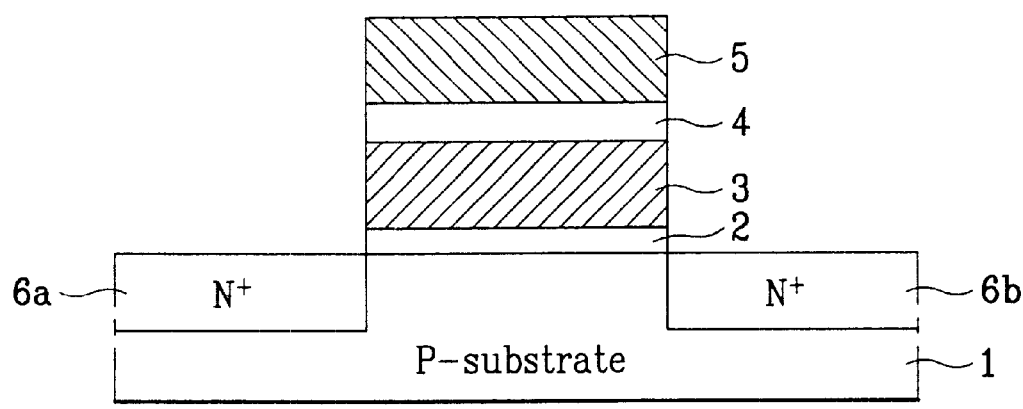
FIG. 1A is a sectional view showing a structure of a simple stacked gate nonvolatile memory device.
Figure 1B:
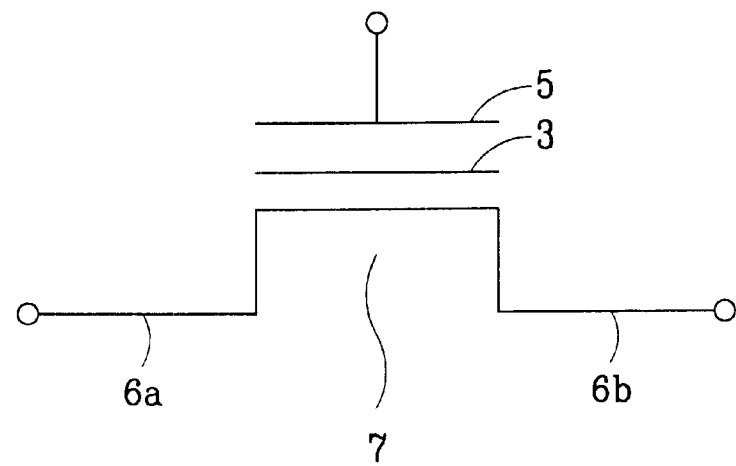
FIG. 1B is a symbol of a general nonvolatile memory cell.
Figure 2A:
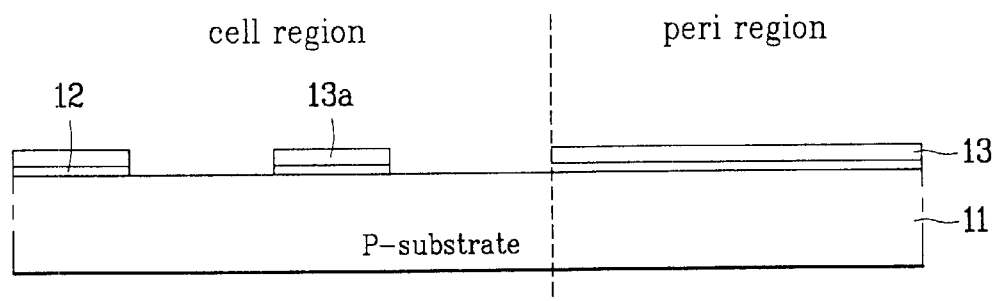
FIG. 2A to FIG. 2K are cross sectional views showing process steps of a fabrication method of a conventional nonvolatile memory device.
Figure 2B:
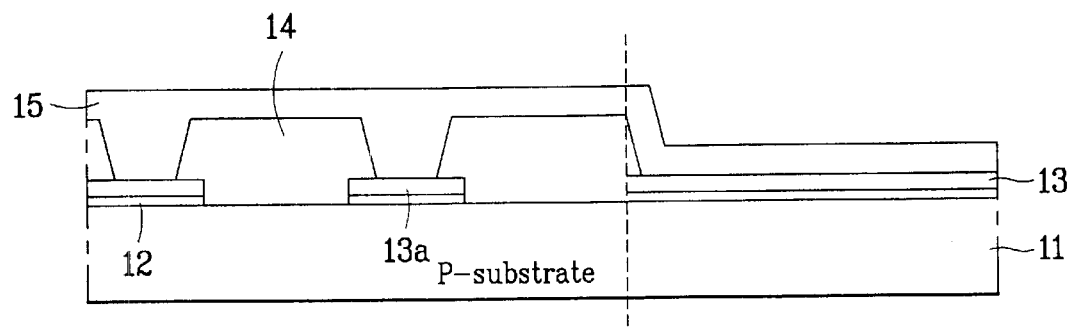
Figure 2C:
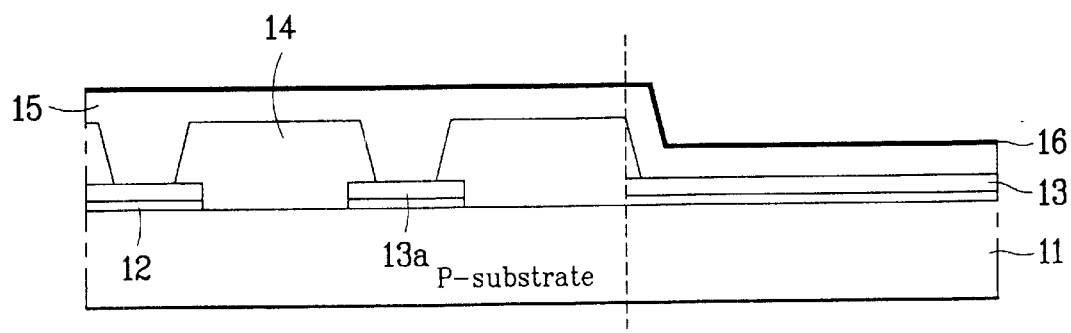
Figure 2D:
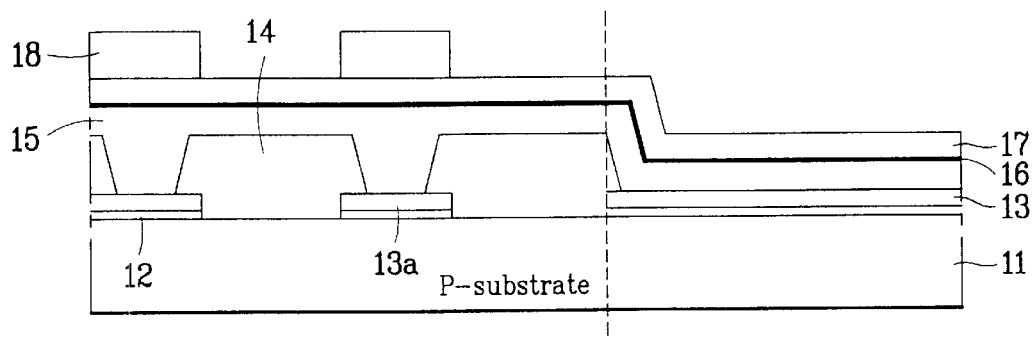
Figure 2E:
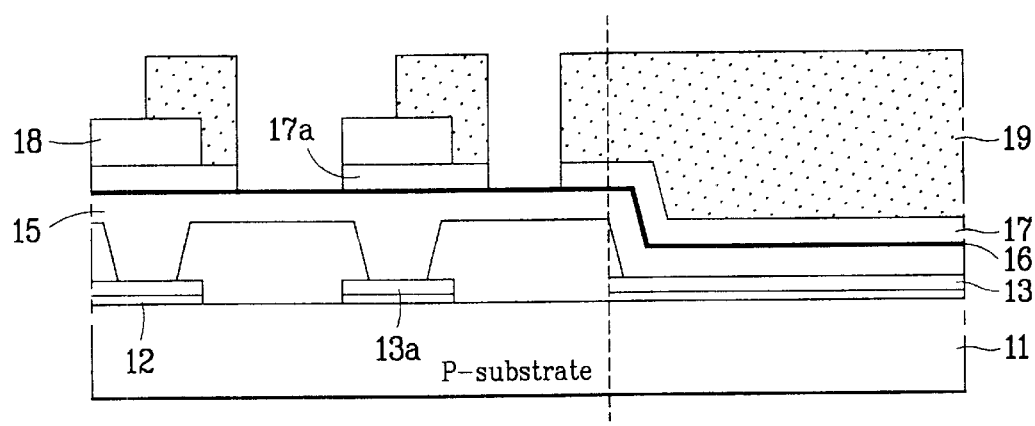
Figure 2F:
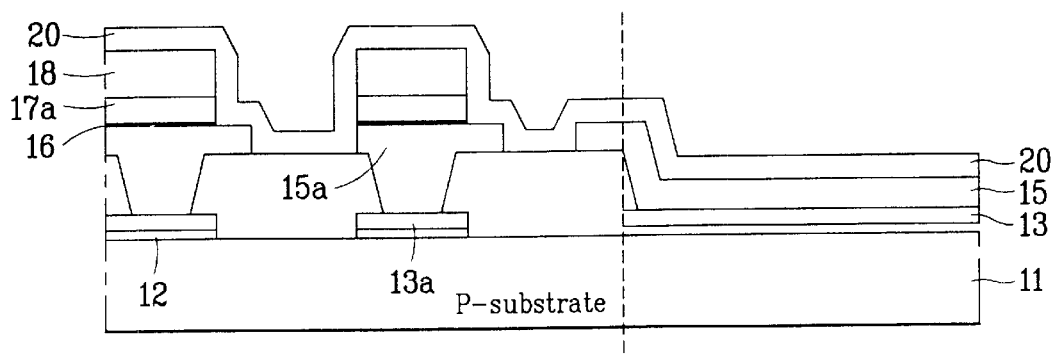
Figure 2G:
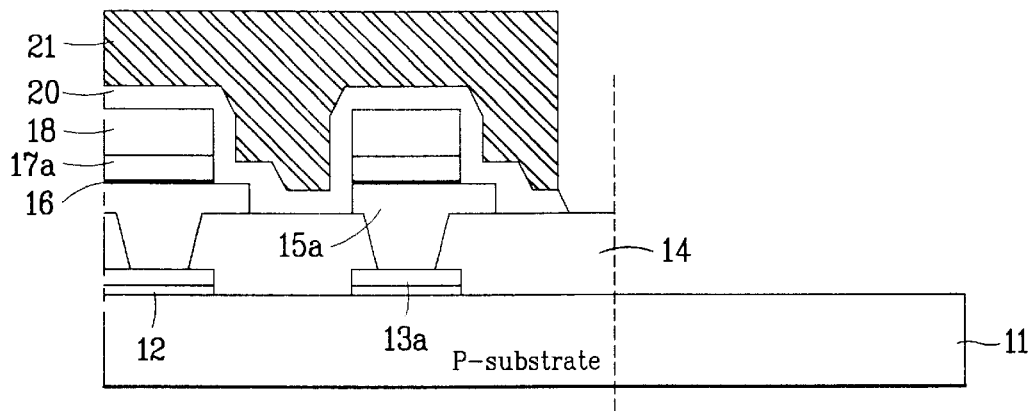
Figure 2H:
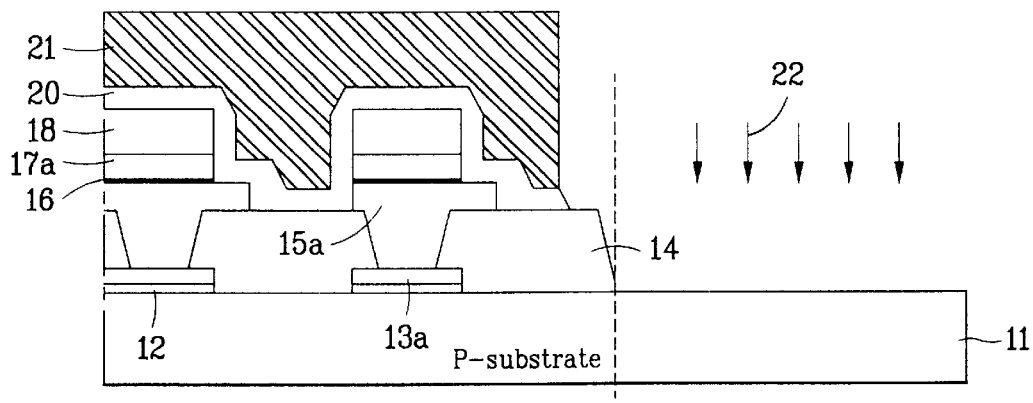
Figure 2I:
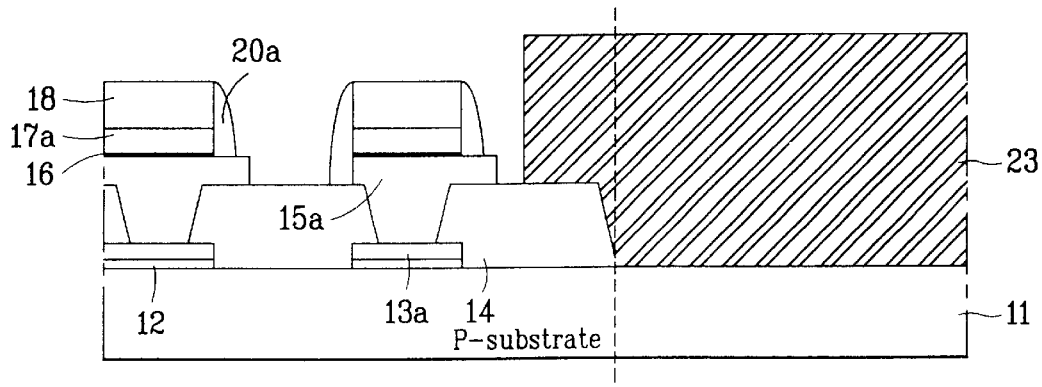
Figure 2J:
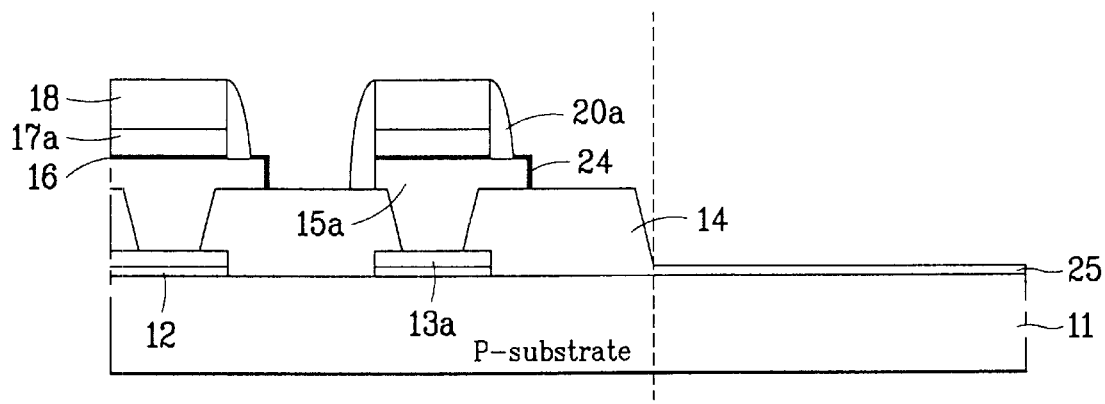
Figure 2K:
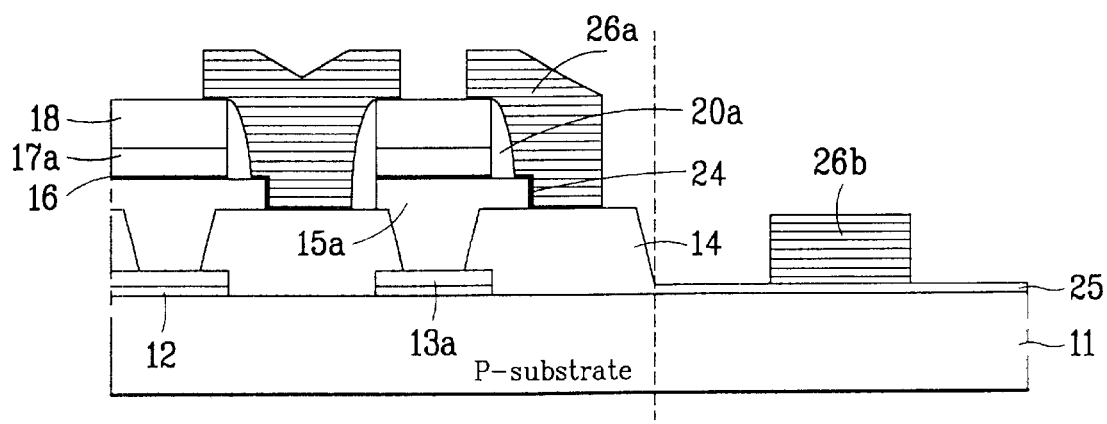
Figure 3A:
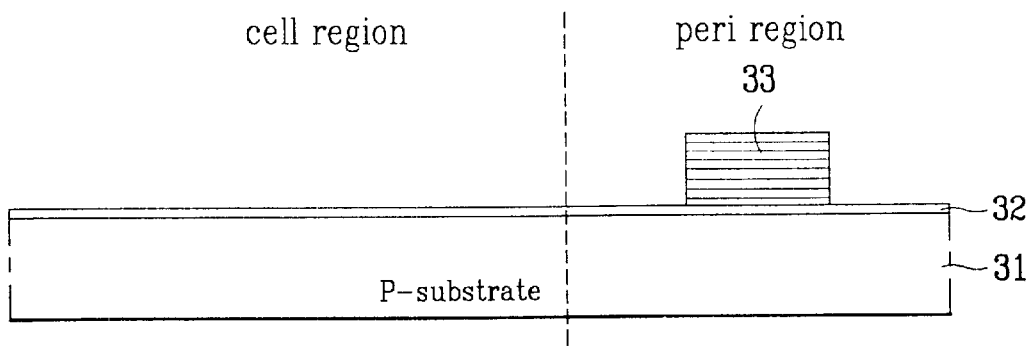
FIG. 3A to FIG. 3I are cross sectional views showing process steps of a fabrication method of a nonvolatile memory device in accordance with the present invention.

Referring to FIG. 3A, a cell region and a peri region are defined on the surface of a p type semiconductor substrate 31. An oxidation film (not shown) for separating elements from each other is formed on the surface of the semiconductor substrate 31 including the cell and peri regions. Channel ions are implanted in the peri (peripheral) region of the semiconductor substrate 31 using photolithography techniques to screen the cell region. Thereafter, a peri gate insulation film 32 is formed on the entire surface of the peri and cell regions of said semiconductor substrate 31.

A first polysilicon layer for forming a peri gate is formed on the peri gate insulation film 32. The first polysilicon layer is selectively removed by photolithography technique and etching process, and therefrom a gate electrode 33 is formed on the peri region. Source and drain impurity regions (not shown) are formed in the peri region by implanting n type impurity ions for source/drain into the semiconductor substrate 31 using photolithography techniques to screen the cell region.

Therefore, the gate electrode 33 and the source/drain impurity regions form a peri element (that is, NMOS transistor) in the peri region of said semiconductor substrate 31.

Figure 3B:
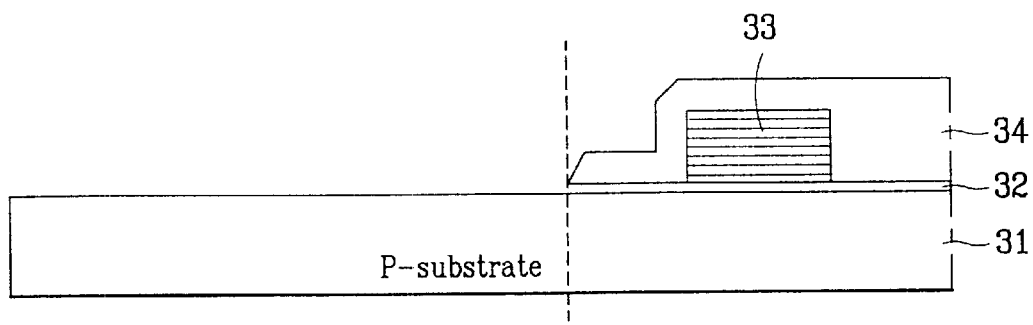

Referring to FIG. 3B, a first insulation film 34 is formed on the entire surface of the semiconductor substrate 31 the including gate electrode 33.

Subsequently, the peri gate insulation film 32 and the first insulation film 34 are selectively removed from the cell region by photolithography technique and etching process.

As the result, the first insulation film 34 remains only on the peri region. Therefore, the peri element formed on the peri region is protected from a subsequent etching processes and an active region is ensured on the cell region.

Figure 3C:
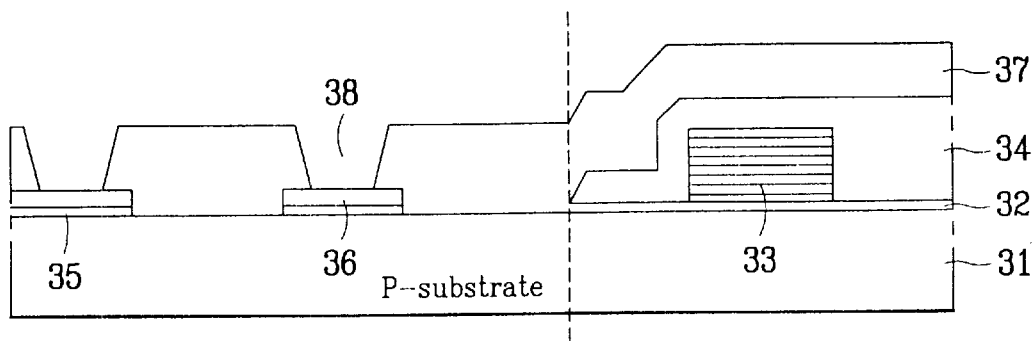

Referring to FIG. 3C, a cell gate insulation film 35 and a second polysilicon layer for a floating gate are formed in sequence on the entire surface of the semiconductor substrate 31 including the first insulation film 34.

The second polysilicon layer may be formed to have a thickness less than 500 Å so as to reduce a step difference between the cell region and the peri region.

The second polysilicon layer and the cell gate insulation film 35 are selectively removed by photolithography technique and etching process so that a plurality of first floating gates 36 separated by a predetermined interval are formed on the cell region.

A second insulation film 37 is formed over the entire surface of the semiconductor substrate 31 including the first floating gate 36, and is selectively removed by photolithography technique and etching process to form a plurality of contact holes in one to one correspondence with each of the plurality of first floating gates 36. Therefore, a portion of each surface of the plurality of first floating gates 36 is exposed through a corresponding contact hole.

Figure 3D:
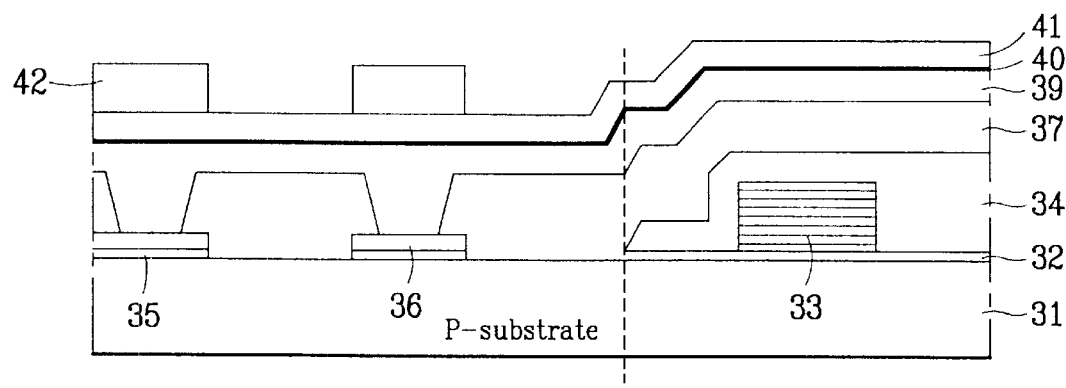

Referring to FIG. 3D, a third polysilicon layer 39 for floating gate is formed over the entire surface of the semiconductor substrate 31 including the contact holes 38. A third insulation film 40 to control an amount of charge of the floating gate on the third polysilicon layer 39 is made of an ONO film or a CVD insulation film. A fourth polysilicon layer 41 for forming a control gate is formed on the third insulation film 40. A cap insulation film 42 is formed on the fourth polysilicon layer 41. Subsequently, the cap insulation film 42 is selectively removed by photolithography and etching processes.

Figure 3E:
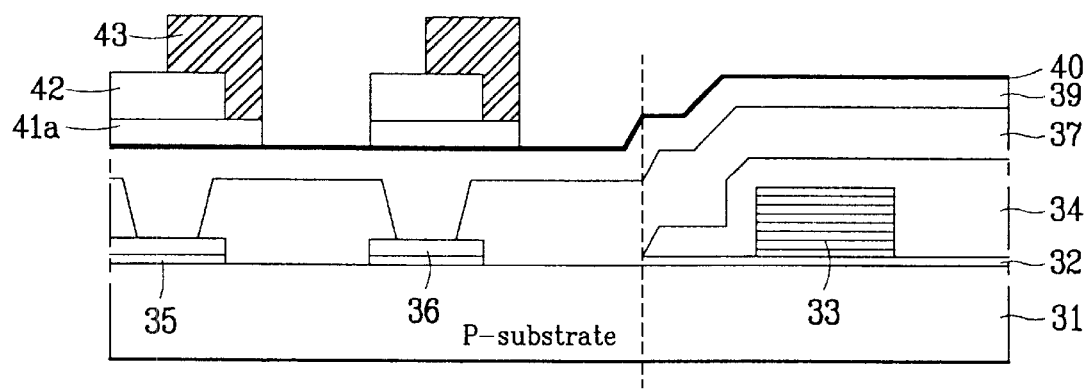

Referring to FIG. 3E, a first photoresist 43 is deposited over the semiconductor substrate 31 including the cap insulation film 42 and then is patterned by an exposure and development process. The patterned first photoresist 43 is illustrated in FIG. 3E.

Subsequently, using the patterned first photoresist 43 and the cap insulation film 42 as a mask, the fourth polysilicon layer 41 is selectively removed and patterned to form a control gate 41a having a width larger than the cap insulation film 42. The patterned control gate 41a having the width larger than the cap insulation film 42 is illustrated in FIG. 3E.

Figure 3F:
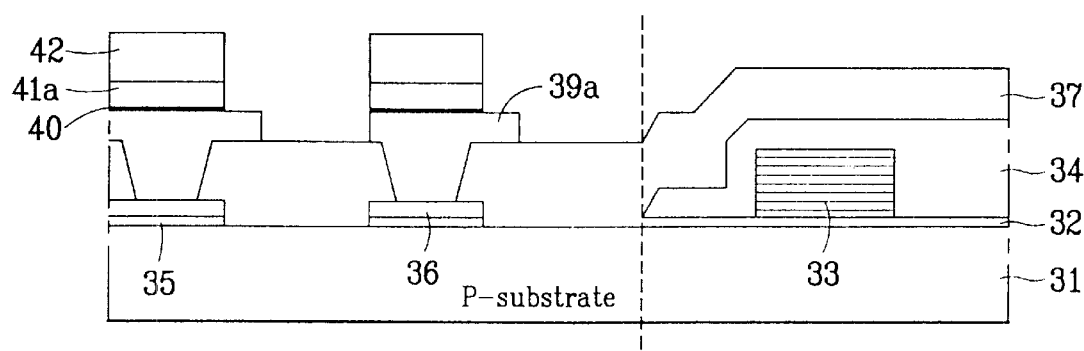

Referring to FIG. 3F, the photoresist 43 is removed. By performing a blank etch process using the cap insulation film 42 as a mask, the third insulation film 40 and the third polysilicon layer 39 are selectively removed so as to form a second floating gate 39a. The second floating gate 39a is illustrated in FIG. 3F.

As shown in FIG. 3F, when the blank etch process is performed, a portion of the control gate 41a which is not overlapped with the cap insulation film 42 is selectively removed. At the same time, the third insulation film 40 and the third polysilicon layer 39 which have been formed below the cap insulation film 42 are also selectively removed. Therefore, the control gate 41a and the cap insulation film 42 have the same width, However, the second floating gate 39a is formed to have the width of the control gate 41a prior to the blank etch process. Therefrom, the control gate 41a and the second gate 39a are formed so as to have a step difference.

Figure 3G:
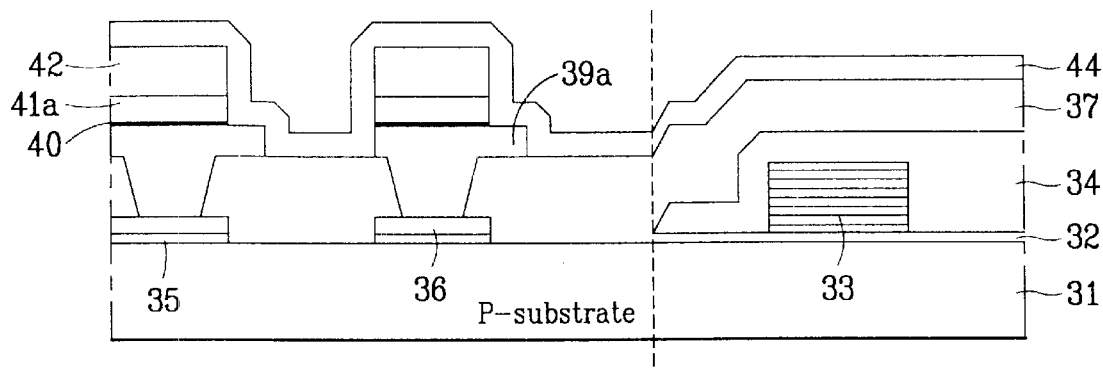
Figure 3H:
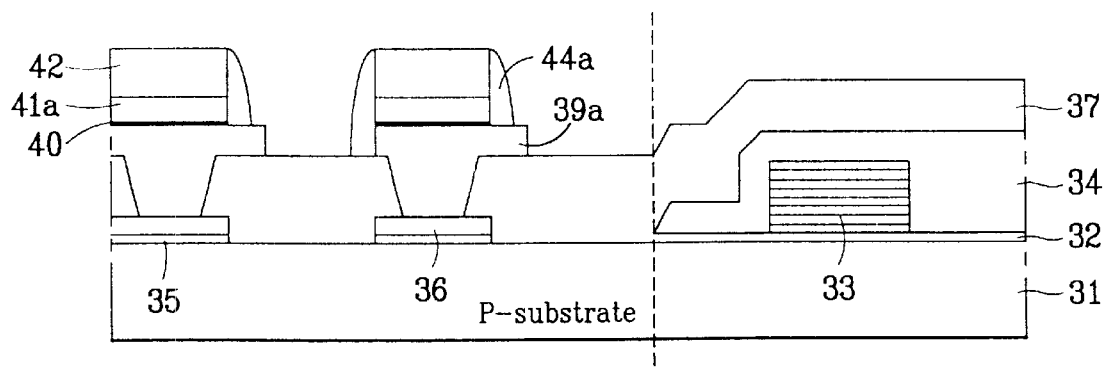

Referring to FIG. 3G, a fourth insulation film 44 is formed on the entire surface of said semiconductor substrate 31 including the cap insulation film 42. Referring to FIG. 3H, an etch back process is performed on the entire surface of the fourth insulation film 44 and therefrom a fourth insulation film sidewall 44a is formed on each side of the control gate 41a and of the cap insulation film 42.

Figure 3I:
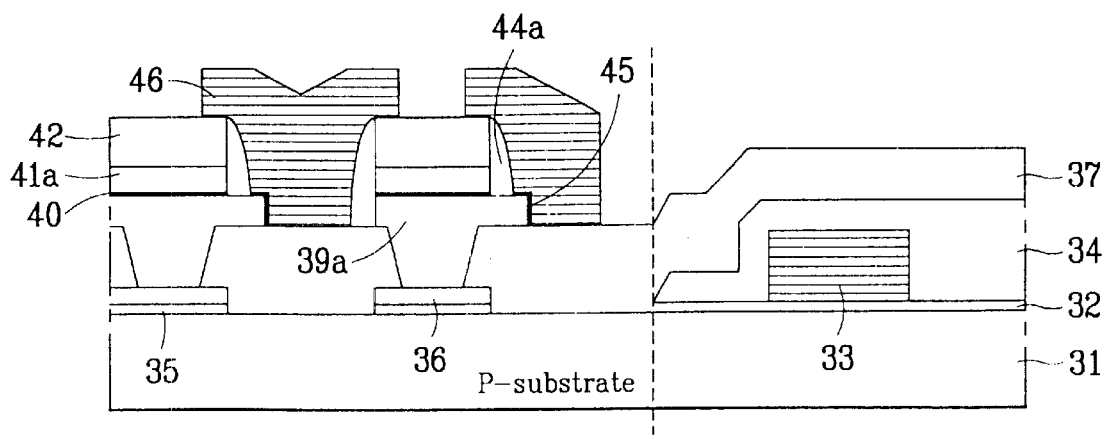

Referring to FIG. 3I, a tunneling oxidation film 45 is formed on the surface of the second floating gate 39a by an oxidation process being performed over the semiconductor substrate 31.

Thereafter, a fifth polysilicon layer for forming an erase gate is formed over the entire surface of said semiconductor substrate 31 and is selectively removed by using a photolithography technique and an etching process so that an erase gate 46 adjacent with the tunneling oxidation film 45 is formed.

Therefore, the erase gate 46 is formed between two adjacent control gates 41a and on the entire tunneling oxide film 45 and is overlapped with a predetermined upper portion of each of the two adjacent cap insulation films 42, as shown in FIG. 3I.

As described above, the fabrication method of the nonvolatile memory device in accordance with the present invention has effects as follows:

According to the first aspect of the present invention, since it is not necessary to perform an over-etch process for removing the polysilicon layer deposited for the first and second floating gates, the surface of the semiconductor substrate is protected from damage, and at the same time the thickness of the cell gate insulation film can be adjusted so that reliability and characteristics of the cell are improved.

According to the second aspect of the present invention, since the tunneling insulation film and the peri gate insulation film are fabricated by separate processes, characteristics of the peri element can be improved and by adjusting the thickness of the tunneling insulation film, the characteristics can be enhanced.

According to the third aspect of the present invention, since a gate electrode in the peri region is formed by independent process, a size of the cell for enhancing the characteristics can be adjusted arbitrarily and the process margin for photo process can be enhanced because of removing a focus difference doing the photo process.

It will be apparent to those skilled in the art that various modifications and variations can be made in the method for fabricating a nonvolatile memory device in accordance with the present invention without departing from the spirit or the scope of the invention. Thus, it is intended that the present invention covers the modifications and variations of this invention provided they come within the scope of the appended claims and their equivalents.

What is claimed is:

1. A fabrication method of nonvolatile memory device, comprising the steps of:

forming a second conductivity type transistor in a peri region of a first conductivity type semiconductor substrate on which a cell region and said peri region are defined;

forming a first insulation film in said peri region over said semiconductor substrate;

forming a plurality of first floating gate structures separated by a predetermined interval in said cell region of said semiconductor substrate;

forming a second insulation film over said semiconductor substrate so as to have a plurality of contact holes, each of said plurality of contact holes exposing a portion of each said plurality of first floating gate structures;

forming a plurality of second floating gates, each second floating gate formed in one of said plurality of contact holes and on a portion of the second insulation film adjacent to the corresponding contact hole;

stacking a control gate structure on a first portion of at least one of said second floating gates;

forming an insulation film sidewall on each side of said control gate structure so as to overlap a second portion of said second floating gate;

forming a tunneling insulation film on a third portion of said second floating gate; and forming an erase gate on said tunneling insulation film.

2. The method of claim 1, wherein said first floating gate structure includes a gate insulation film formed on said semiconductor substrate and a conductive layer formed on said gate insulation film.

3. The method of claim 1, wherein said control gate structure includes a third insulation film formed of said first portion of said second floating gate, a control gate formed on said third insulation film, and a cap insulation film formed on said control gate.

4. The method of claim 3, wherein said third insulation film is made of at least one of an ONO film and a CVD insulation film.

5. The method of claim 2, wherein said conductive layer has a thickness at the most equal to 500 Å.

6. The method of claim 1, wherein the step of forming said transistor includes the steps of;
   implanting channel ions in the peri region of said semiconductor substrate;
   forming a peri gate insulation film on an entire surface of said semiconductor substrate;
   forming a polysilicon layer on said peri gate insulation film;
   forming a gate electrode by selectively removing said polysilicon layer; and
   forming a source impurity region and a drain impurity region in said peri region of said semiconductor substrate.

7. The method of claim 1, wherein said tunneling insulation film is formed on said third portion of said second floating gate by an oxidation process.

8. The method of claim 1, wherein said first conductivity type is p type and said second conductivity type is n type.

9. The method of claim 1, wherein said control gate structure is formed on said second floating gate so as to have a step difference and a width less than said second floating gate.

10. The method of claim 1, wherein
   the stacking step stacks said control gate structure on at least two of said second gates which are adjacent to one another; and
   the forming an erase gate step forms at least one erase gate on said tunneling insulation film disposed between said adjacent control gate structures.

11. A fabrication method of nonvolatile memory device, comprising the steps of:
   forming a second conductivity type transistor in a peri region of a first conductivity type semiconductor substrate on which a cell region and the peri region are defined;
   forming a first insulation film on the peri region of said semiconductor substrate;
   forming a plurality of first floating gates separated from each other by a predetermined interval in the cell region of said semiconductor substrate with a gate insulation film between each of said plurality of first gates and said cell region of said semiconductor substrate;
   forming a second insulation film having a plurality of contact holes over the entire surface of said semiconductor substrate so as to expose a predetermined portion of each surface of said plurality of first floating gates;
   forming a first conductivity film, a third insulation film, and a second conductivity film in sequence over said semiconductor substrate including said contact holes;
   forming a cap insulation film on a predetermined region on said second conductivity film;
   forming a mask layer on a first portion of said cap insulation film;
   forming a control gate by selectively removing said first conductivity film using said cap insulation film and said mask layer as a mask;
   removing said mask layer;
   forming a second floating gate by selectively removing said third insulation film and said first conductivity film using said cap insulation film as a mask;
   forming a fourth insulation film sidewall on each side of said control gate and said cap insulation film;
   forming a tunneling insulation film on an exposed portion of a surface of each said second floating gate; and
   forming an erase gate on at least one of said tunneling insulation films.

12. The method of claim 11, wherein said third insulation film is made of at least one of an ONO film and a CVD insulation film.

13. The method of claim 11, wherein said first floating gate has a thickness at the most equal to 500 Å.

14. The method of claim 11, wherein the step of forming said transistor includes the steps of;
   implanting channel ions in the peri region of said semiconductor substrate;
   forming a peri gate insulation film on the entire surface of said semiconductor substrate;
   forming a polysilicon layer on said gate insulation film;
   forming a gate electrode by selectively removing said polysilicon layer; and
   forming a source impurity region and a drain impurity region in said peri region of said semiconductor substrate.

15. The method of claim 11, wherein said tunneling insulation film is formed on said exposed portion of said surface of each said second floating gate by an oxidation process.

16. The method of claim 11, wherein said first conductivity type is p type and said second conductivity type n type.

17. The method of claim 11, wherein said control gate is formed on each said second floating gate so as to have a step difference and a width less than said second floating gate.

18. The method of claim 11, wherein the forming an erase gate step forms at least one erase gate on said tunneling insulation film disposed between two adjacent control gates.

* * * * *